United States Patent
Tsuchiya et al.

(10) Patent No.: US 10,745,588 B2
(45) Date of Patent: Aug. 18, 2020

(54) SILICON WAFER POLISHING COMPOSITION

(71) Applicants: FUJIMI INCORPORATED, Kiyosu-shi, Aichi (JP); TOAGOSEI CO., LTD., Minato-ku, Tokyo (JP)

(72) Inventors: Kohsuke Tsuchiya, Kiyosu (JP); Hisanori Tansho, Kiyosu (JP); Taiki Ichitsubo, Kiyosu (JP); Yoshio Mori, Kiyosu (JP)

(73) Assignees: FUJIMI INCORPORATED, Kiyosu-Shi (JP); TOAGOSEI CO., LTD., Tokyo (JP)

( * ) Notice: Subject to any disclaimer, the term of this patent is extended or adjusted under 35 U.S.C. 154(b) by 0 days.

(21) Appl. No.: 15/602,679

(22) Filed: May 23, 2017

(65) Prior Publication Data

US 2017/0253767 A1 Sep. 7, 2017

Related U.S. Application Data

(62) Division of application No. 14/895,318, filed as application No. PCT/JP2014/062176 on May 2, 2014.

(30) Foreign Application Priority Data

Jun. 7, 2013 (JP) ................................. 2013-120328
Jan. 23, 2014 (JP) ................................. 2014-010836

(51) Int. Cl.
| | |
|---|---|
| C09G 1/02 | (2006.01) |
| C09K 3/14 | (2006.01) |
| H01L 21/02 | (2006.01) |
| B24B 37/04 | (2012.01) |
| B24B 37/00 | (2012.01) |

(52) U.S. Cl.
CPC ............... *C09G 1/02* (2013.01); *B24B 37/00* (2013.01); *B24B 37/044* (2013.01); *C09K 3/1436* (2013.01); *C09K 3/1463* (2013.01); *H01L 21/02024* (2013.01); *H01L 21/02052* (2013.01)

(58) Field of Classification Search
CPC .... C09G 1/02; C09K 3/1463; H01L 21/02052
See application file for complete search history.

(56) References Cited

U.S. PATENT DOCUMENTS

| | | | | |
|---|---|---|---|---|
| 6,454,819 B1* | 9/2002 | Yano | ..................... | C08G 83/001 106/3 |
| 2006/0148667 A1* | 7/2006 | Fukasawa | ................ | C09G 1/02 510/178 |
| 2007/0175104 A1 | 8/2007 | Nishiyama et al. | | |
| 2008/0206995 A1* | 8/2008 | Tomiga | ..................... | C09G 1/02 438/693 |
| 2009/0093118 A1 | 4/2009 | Uotani et al. | | |
| 2009/0289217 A1 | 11/2009 | Sato et al. | | |
| 2010/0267315 A1 | 10/2010 | Sato et al. | | |
| 2010/0301014 A1* | 12/2010 | Mizuno | ..................... | C09G 1/02 216/83 |
| 2011/0081780 A1* | 4/2011 | Shida | ....................... | C09G 1/02 438/693 |
| 2011/0117821 A1 | 5/2011 | Nishimoto et al. | | |
| 2012/0270400 A1 | 10/2012 | Takegoshi et al. | | |
| 2014/0030897 A1 | 1/2014 | Teramoto et al. | | |
| 2015/0017806 A1* | 1/2015 | Akutsu | ................ | C09K 3/1409 438/693 |
| 2015/0111383 A1* | 4/2015 | Miura | ............... | H01L 21/02024 438/693 |

FOREIGN PATENT DOCUMENTS

| | | |
|---|---|---|
| EP | 1 870 928 A1 | 12/2007 |
| JP | 4772156 B1 | 9/2011 |
| JP | 2012-533649 A | 12/2012 |
| JP | 2013-222863 A | 10/2013 |
| TW | 200942602 A | 10/2009 |
| TW | 201346017 A | 11/2013 |
| WO | WO-2004/068570 A1 | 8/2004 |
| WO | WO-2006/112519 A1 | 10/2006 |
| WO | WO-2007/055278 A1 | 5/2007 |
| WO | WO-2008/013226 A1 | 1/2008 |
| WO | WO-2010/122985 A1 | 10/2010 |
| WO | WO-2011/008658 A1 | 1/2011 |
| WO | WO-2013/157554 A1 | 10/2013 |

OTHER PUBLICATIONS

"Size_and_Length_of_Polymers", Department of Chemistry Materials, Webpage, No date.

\* cited by examiner

*Primary Examiner* — Thomas T Pham
(74) *Attorney, Agent, or Firm* — Foley & Lardner LLP

(57) ABSTRACT

This invention provides a silicon wafer polishing composition used in the presence of an abrasive. The composition comprises a silicon wafer polishing accelerator, an amide group-containing polymer, and water. The amide group-containing polymer has a building unit A in its main chain. The building unit A comprises a main chain carbon atom constituting the main chain of the amide group-containing polymer and a secondary amide group or a tertiary amide group. The carbonyl carbon atom constituting the secondary amide group or tertiary amide group is directly coupled to the main chain carbon atom.

19 Claims, No Drawings

SILICON WAFER POLISHING COMPOSITION

CROSS-REFERENCE TO RELATED APPLICATIONS

The present application is a divisional application of U.S. application Ser. No. 14/895,318, filed Dec. 2, 2015, which is a National Stage of International Application No. PCT/JP2014/062176, filed May 2, 2014, which claims the benefit of priority from Japanese Patent Application No. 2013-120328, filed Jun. 7, 2013 and Japanese Patent Application No. 2014-010836, filed Jan. 23, 2014; the entire contents of all of which are incorporated herein by reference.

TECHNICAL FIELD

The present invention relates to a polishing composition used for polishing silicon wafers.

BACKGROUND ART

The surface of a silicon wafer used as a component of a semiconductor device, etc., is generally polished to a high quality mirror finish via a lapping step (rough polishing step) and a polishing step (precision polishing step). The polishing step typically comprises a preliminary polishing step and a final polishing step. As the polishing method in the polishing step, chemical mechanical polishing is known, where a water-soluble polymer typified by cellulose derivatives, etc., is included in the polishing liquid. In this method, the water-soluble polymer is adsorbed on and released from the abrasive and silicon wafer, thereby contributing to reduce defects and haze in polished surface. As a technical literature related to silicon wafer polishing compositions, for instance, Patent Document 1 is cited. Patent Document 2 is a technical literature about a polish used for polishing silicon oxide.

CITATION LIST

Patent Literature

[Patent Document 1] Japanese Patent No. 4772156
[Patent Document 2] WO 2007/055278

SUMMARY OF INVENTION

Technical Problem

Since the cellulose derivative is a polymer derived from a natural compound (cellulose), there are limitations in managing the chemical structure and purity as compared with a polymer obtainable by artificial polymerization of monomers (or a synthetic polymer, hereinafter). For instance, commercially readily available cellulose derivatives are limited in weight average molecular weight and range of molecular weight distribution (ratio of weight average molecular weight (Mw) to number average molecular weight (Mn)). In addition, since they are derived from natural compounds, it is difficult to significantly reduce impurities and local disorder (microscale aggregation, etc.) in their polymer structures, etc., that may cause surface defect. The amounts and extent of such impurities, etc., are likely to vary widely as well. With a tendency of design rules for semiconductor devices to become finer, growing demands are expected for their surface quality (typically fewer defects, low haze, etc.) after polished. In this view, it will be useful to provide a polishing composition excellent in reducing defects and haze, with the composition not essentially requiring a cellulose derivative.

Solution to Problem

The present inventors have searched for polymers highly capable of controlling the adsorption and release of a water-soluble polymer on and from abrasives and silicon wafers as described above and have resulted in findings that a composition that comprises a polymer having a certain structure exhibits excellent effect to reduce defects and haze in a polished surface. In other words, an objective of the present invention is to provide a silicon wafer polishing composition capable of producing excellent effect to reduce defects and haze in a polished surface.

To achieve the objective, this description provides a silicon wafer polishing composition used in the presence of an abrasive. The composition comprises a silicon wafer polishing accelerator, an amide group-containing polymer, and water. The amide group-containing polymer has a building unit A in its main chain. The building unit A comprises a main chain carbon atom constituting the main chain of the amide group-containing polymer and a secondary amide group or a tertiary amide group. The carbonyl carbon atom constituting the secondary amide group or tertiary amide group is directly coupled to the main chain carbon atom. An amide group-containing polymer having this structure effectively contributes to reduce defects and haze in a silicon wafer surface, that is, a polishing object. Thus, polishing with the silicon wafer polishing composition (or simply the "polishing composition" hereinafter) can effectively reduce defects and haze in a polished surface.

In a preferable embodiment of the art disclosed herein, the building unit A is derived from at least one species selected from a group consisting of monomers represented by the next general formula (1):

[Chem 1]

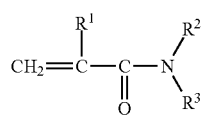

(1)

(in the formula, $R^1$ is a hydrogen atom, methyl group, phenyl group, benzyl group, chloro group, difluoromethyl group, trifluoromethyl group, or cyano group. $R^2$ and $R^3$ are identical or different, with each being a hydrogen atom; an alkyl group, alkenyl group, alkynyl group, aralkyl group, alkoxy group, alkoxyalkyl group, alkylol group, acetyl group with 1 to 18 carbon atoms; or an aromatic group with 6 to 60 carbon atoms; each of which except for the hydrogen atom includes a species having a substituent although this is not applicable to an embodiment where each of $R^2$ and $R^3$ is a hydrogen atom);

monomers represented by the next general formula (2):

[Chem 2]

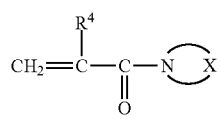

(2)

(in the formula, $R^4$ is a hydrogen atom, methyl group, phenyl group, benzyl group, chloro group, difluoromethyl group, trifluoromethyl group, or cyano group; and X is $(CH_2)_n$ (n is an integer between 4 and 6), $(CH_2)_2O(CH_2)_2$ or $(CH_2)_2S(CH_2)_2$); and monomers represented by the next general formula (3):

[Chem 3]

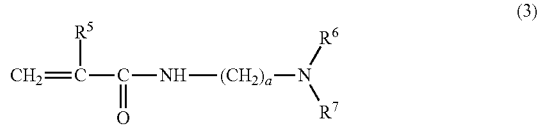

(3)

($R^5$ is a hydrogen atom, methyl group, phenyl group, benzyl group, chloro group, difluoromethyl group, trifluoromethyl group, or cyano group. $R^6$ and $R^7$ are identical or different, with each being a hydrogen atom; an alkyl group, alkenyl group, alkynyl group, aralkyl group, alkoxy group, alkoxyalkyl group, alkylol group, acetyl group with 1 to 8 carbon atoms; or an aromatic group with 6 to 60 carbon atoms; each of which except for the hydrogen atom includes a species having a substituent; and a is an integer between 1 and 5). According to a polishing composition comprising an amide group-containing polymer having the building unit, the effect to reduce defects and haze is produced to a greater extent.

In a preferable embodiment of the art disclosed herein, the amide group-containing polymer is nonionic. The use of a polishing composition comprising a nonionic amide group-containing polymer preferably brings about the effect to reduce defects and haze.

In a preferable embodiment of the art disclosed herein, the abrasive is silica grains. In polishing using silica grains as the abrasive, the effect of the amide group-containing polymer to reduce defects and haze is preferably produced.

This description also provides a rinse composition for silicon wafers, with the composition comprising a silicon wafer polishing accelerator, an amide group-containing polymer, and water. In this composition, the amide group-containing polymer has a building unit A in its main chain. The building unit A comprises a main chain carbon atom constituting the main chain of the amide group-containing polymer and a secondary amide group or a tertiary amide group. The carbonyl carbon atom constituting the secondary amide group or tertiary amide group is directly coupled to the main chain carbon atom. Such a rinse composition is preferably used, for instance, as a rinse solution for use after polishing carried out in the presence of an abrasive (typically, polishing carried out in the presence of an abrasive, using a polishing composition that comprises the silicon wafer polishing accelerator, the amide group-containing polymer and water). The rinse solution can further reduce defects and haze without hindering the effect of the amide group-containing polymer adsorbed on the silicon wafer surface.

DESCRIPTION OF EMBODIMENTS

Preferred embodiments of the present invention are described below. Matters necessary to implement this invention other than those specifically referred to in this description may be understood as design matters to a person of ordinary skill in the art based on the conventional art in the pertinent field. The present invention can be implemented based on the contents disclosed in this description and common technical knowledge in the subject field.

<Amide Group-Containing Polymer>

The polishing composition disclosed herein is characterized by comprising an amide group-containing polymer that has a building unit A in its main chain. The amide group-containing polymer is typically a water-soluble polymer. The building unit A comprises a main chain carbon atom constituting the main chain of the amide group-containing polymer and a secondary amide group or a tertiary amide group. The amide group-containing polymer disclosed herein may comprise one species of building unit A, or two or more species of building unit A.

The main chain carbon atom in the building unit A comprises an α-carbon atom specified in relation to the carbonyl carbon atom constituting the secondary amide group or tertiary amide group. The building unit A may also comprise a β-carbon atom. These α- and β-carbon atoms may correspond to two carbon atoms that constitute an ethylenic unsaturated bond in a polymerizable monomer described later. A hydrogen atom bonded to the main chain carbon atom (typically an α-carbon atom) may be substituted with a substituent such as a methyl group, phenyl group, benzyl group, chloro group, difluoromethyl group, trifluoromethyl group, cyano group, etc.

The carbonyl carbon atom constituting the secondary amide group or tertiary amide group is directly coupled to the main chain carbon atom (α-carbon atom). By polishing using an amide group-containing polymer that has a building unit as described above in its main chain, defects and haze are effectively reduced in silicon wafer surfaces.

The secondary amide group is represented by a formula —CONHR$^a$ and the tertiary amide group is represented by a formula —CONR$^a$R$^b$. In the formulas, R$^a$ in the secondary amide group as well as R$^a$ and R$^b$ in the tertiary amide group is an organic group. For instance, it can be an organic group with 1 to 18 carbon (C) atoms. In addition to C and H, the organic group may comprise N, as a nitrogen constituting a form such as an amide, amine, nitrile or the like; an oxygen atom (O), as an oxygen constituting a form such as an ester, ether, ketone, hydroxyl group, or the like; and further a sulfur atom (S), as a sulfur constituting a form such as a thioether or the like. R$^a$ and R$^b$ in the tertiary amide group may be connected to N directly or via O or S. Preferable examples of R$^a$ in the secondary amide group as well as of R$^a$ and R$^b$ in the tertiary amide group include R$^2$ and R$^3$ in the general formula (1) described later and $(CH_2)_a$—NR$^6$R$^7$ in the general formula (3) also described later. R$^a$ and R$^b$ in the tertiary amide group may be linked to each other to form —X— in the general formula (2) described later. R$^a$ and R$^b$ in the tertiary amide group may be identical or different. The building unit A may be essentially free of a primary amide group.

The building unit A is preferably derived from a polymerizable monomer (a). Thus, the amide group-containing polymer disclosed herein is preferably a polymer obtainable by polymerizing or copolymerizing a monomer material that comprises one, two or more species of polymerizable monomer (a).

The polymerizable monomer (a) has a polymerizable group typically having an ethylenic unsaturated bond. Herein, the term ethylenic unsaturated bond refers to a radically polymerizable carbon-carbon double bond. A hydrogen atom bonded to a carbon atom constituting the ethylenic unsaturated bond may be substituted with an aforementioned substituent. Examples of the polymerizable group having an ethylenic unsaturated bond include acryloyl group and an α-substituted derivative (e.g. methacryloyl group, α-phenylacryloyl group, etc.) substituted with the substituent. In particular, a polymerizable monomer (a) that comprises a (meth)acryloyl group as the polymerizable group is preferable.

In other words, the polymerizable monomer (a) is also an α,β-unsaturated carbonyl compound. The α,β-unsaturated carbonyl compound is preferably an α,β-unsaturated carboxylic acid amide. In such a case, the carboxylic acid amide group in the α,β-unsaturated carboxylic acid amide is the aforementioned secondary amide group or tertiary amide group. The α,β-unsaturated carbonyl compound can be an α-substituted derivative having an aforementioned substituent.

The building unit A is preferably derived from at least one species of polymerizable monomer (a) (or simply "monomer" hereinafter) represented by the following formula (1), (2) or (3). The amide group-containing polymer disclosed herein is preferably a polymer obtainable by polymerizing or copolymerizing a monomer material that comprises at least one species of monomer represented by the following formula (1), (2) or (3).

Monomers represented by a general formula (1);

[Chem 4]

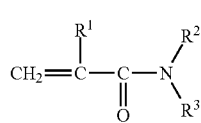

(1)

In the general formula (1), $R^1$ is a hydrogen atom; an alkyl group, alkenyl group, alkenyl group, aralkyl group, alkoxy group, alkoxyalkyl group, alkylol group, acetyl group with 1 to 6 carbon atoms; phenyl group; benzyl group; chloro group; difluoromethyl group; trifluoromethyl group; or cyano group. $R^1$ is preferably selected from a hydrogen atom, methyl group, phenyl group, benzyl group, chloro group, difluoromethyl group, trifluoromethyl group, and cyano group; and more preferably a hydrogen atom, methyl group, or phenyl group. $R^2$ and $R^3$ are each a group selected from a hydrogen atom; a possibly substituted alkyl group, alkenyl group, alkynyl group, aralkyl group, alkoxy group, alkoxyalkyl group, alkylol group, acetyl group, and aromatic group. In the possibly substituted alkyl group, alkenyl group, alkynyl group, aralkyl group, alkoxy group, alkoxyalkyl group, alkylol group and acetyl group, the total number of carbon atoms is 1 to 40 (preferably 1 to 24, more preferably 1 to 14, or yet more preferably 1 to 10). In the alkyl group, alkenyl group, alkynyl group, aralkyl group, alkoxy group, alkoxyalkyl group, alkylol group and acetyl group excluding the substituent if any, the total number of carbon atoms is 1 to 18 (preferably 1 to 8, or more preferably 1 to 4). The possibly substituted alkyl group, alkenyl group, alkynyl group, aralkyl group, alkoxy group, alkoxyalkyl group, alkylol group and acetyl group can be acyclic (linear or branched) or cyclic, but preferably is acyclic. The aromatic group is a possibly substituted aryl group. In the aromatic group, the total number of carbon atoms is 6 to 60 (preferably 6 to 36, more preferably 6 to 24, or yet more preferably 6 to 12). The possible substituent on the alkyl group, alkenyl group, alkynyl group, aralkyl group, alkoxy group, alkoxyalkyl group, alkylol group, acetyl group or aromatic group encompasses hydroxyl group; a halogen atom such as a chlorine atom; and cyano group. The possible substituent on the alkyl group, alkenyl group, alkynyl group, aralkyl group, alkoxy group, alkoxyalkyl group, alkylol group or acetyl group further encompasses the aromatic groups described above. The possible substituent on the aromatic group encompasses aforementioned alkyl group, alkenyl group, alkynyl group, aralkyl group, alkoxy group, alkoxyalkyl group, alkylol group and acetyl group. In particular, $R^2$ and $R^3$ are each preferably a hydrogen atom or an alkyl group with 1 to 18 (preferably 1 to 8, e.g. 1 to 4, typically 1, 2 or 3) carbon atoms. The alkyl group may be linear or branched. $R^2$ and $R^3$ are also each preferably an alkoxy group, alkoxyalkyl group, alkylol group or acetyl group. The alkoxy group is preferably an alkoxy group having 1 to 8 (e.g. 1 to 6, typically 1 to 4) carbon atoms, such as methoxy group. The alkoxyalkyl group is preferably an alkoxyalkyl group having 1 to 8 (e.g. 1 to 6, typically 1 to 4) carbon atoms, such as methoxymethyl group, ethoxyethyl group, propoxymethyl group and butoxymethyl group. The alkylol group is more preferably an alkylol group having 1 to 8 (e.g. 1 to 6, typically 1, 2 or 3) carbon atoms, such as methylol group, ethylol group and propylol group. $R^2$ and $R^3$ may be identical or different although this is not applicable to an embodiment where each of $R^2$ and $R^3$ is a hydrogen atom.

Monomers represented by a general formula (2):

[Chem 5]

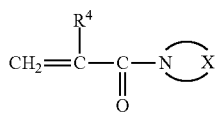

(2)

In the general formula (2), $R^4$ is a hydrogen atom, methyl group, phenyl group, benzyl group, chloro group, difluoromethyl group, trifluoromethyl group, or cyano group. Among them, the hydrogen atom, methyl group and phenyl group are preferable. X can be $(CH_2)_n$, with n being an integer between 4 and 6. X can also be $(CH_2)_2O(CH_2)_2$ or $(CH_2)_2S(CH_2)_2$. At least one hydrogen atom that constitutes X can be substituted with the alkyl group, alkenyl group, alkynyl group, aralkyl group, alkoxy group, alkoxyalkyl group, alkylol group, acetyl group, or aromatic group in general formula (1); or with a hydroxyl group, halogen atom, amino group, cyano group, or the like.

Monomers represented by a general formula (3):

[Chem 6]

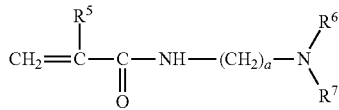

(3)

In the general formula (3), $R^5$ is a hydrogen atom, methyl group, phenyl group, benzyl group, chloro group, difluoromethyl group, trifluoromethyl group, or cyano group. Among them, a hydrogen atom, methyl group and phenyl group are preferable. $R^6$ and $R^7$ are each a group selected from a hydrogen atom; a possibly substituted alkyl group, alkenyl group, alkynyl group, aralkyl group, alkoxy group, alkoxyalkyl group, alkylol group, acetyl group, and aromatic group. In the possibly substituted alkyl group, alkenyl group, alkynyl group, aralkyl group, alkoxy group, alkoxyalkyl group, alkylol group and acetyl group, the total number of carbon atoms is 1 to 40 (preferably 1 to 24, more preferably 1 to 14, or yet more preferably 1 to 10). In the alkyl group, alkenyl group, alkynyl group, aralkyl group, alkoxy group, alkoxyalkyl group, alkylol group and acetyl group excluding the substituent if any, the total number of carbon atoms is 1 to 18 (preferably 1 to 8, or more preferably 1 to 4). The possibly substituted alkyl group, alkenyl group, alkynyl group, aralkyl group, alkoxy group, alkoxyalkyl group, alkylol group and acetyl group can be acyclic (linear or branched) or cyclic, but preferably is acyclic. The aromatic group is a possibly substituted aryl group. In the aromatic group, the total number of carbon atoms is 6 to 60 (preferably 6 to 36, more preferably 6 to 24, or yet more preferably 6 to 12). The possible substituent on the alkyl group, alkenyl group, alkynyl group, aralkyl group, alkoxy group, alkoxyalkyl group, alkylol group, acetyl group or aromatic group encompasses hydroxyl group; a halogen atom (halide group) such as a chlorine atom (chloro group); and cyano group. The possible substituent on the alkyl group, alkenyl group, alkynyl group, aralkyl group, alkoxy group, alkoxyalkyl group, alkylol group or acetyl group further encompasses the aromatic groups described above. The possible substituent on the aromatic group encompasses aforementioned alkyl group, alkenyl group, alkynyl group, aralkyl group, alkoxy group, alkoxyalkyl group, alkylol group and acetyl group. In particular, $R^6$ and $R^7$ are each preferably a hydrogen atom or an alkyl group with 1 to 8 (e.g. 1 to 4, typically 1, 2 or 3) carbon atoms. The alkyl group may be linear or branched. $R^6$ and $R^7$ are also each preferably an alkoxy group, alkoxyalkyl group, alkylol group or acetyl group. The alkoxy group is preferably an alkoxy group having 1 to 8 (e.g. 1 to 6, typically 1 to 4) carbon atoms, such as a methoxy group. The alkoxyalkyl group is preferably an alkoxyalkyl group having 1 to 8 (e.g. 1 to 6, typically 1 to 4) carbon atoms, such as a methoxymethyl group, ethoxyethyl group, propoxymethyl group and butoxymethyl group. The alkylol group is more preferably an alkylol group having 1 to 8 (e.g. 1 to 6, typically 1, 2 or 3) carbon atoms, such as a methylol group, ethylol group and propylol group. $R^6$ and $R^7$ may be identical or different.

Examples of the polymerizable monomer (a) disclosed herein include acrylamide derivatives such as N-mono-substituted and N,N-di-substituted acrylamides, α-substituted derivatives of these (e.g. N-mono-substituted and N,N-di-substituted methacrylamides), and the like. Specific examples of the N-mono-substituted derivative include N-monoalkylacrylamides such as N-methylacrylamide, N-ethylacrylamide, N-propylacrylamide, N-isopropylacrylamide, N-butylacrylamide, N-isobutylacrylamide, N-tert-butylacrylamide, N-heptylacrylamide, N-octylacrylamide, N-tert-octylacrylamide, N-dodecylacrylamide, N-octadecylacrylamide, etc.; substituted N-monoalkylacrylamides such as N-(2-hydroxyethyl)acrylamide, N-(1,1-dimethyl-2-hydroxyethyl)acrylamide, N-(1-ethyl-hydroxyethyl)acrylamide, N-(2-chloroethyl)acrylamide, N-(2,2,2-trichloro-1-hydroxyethyl)acrylamide, N-(2-dimethylaminoethyl)acrylamide, N-(3-dimethylaminopropyl)acrylamide, N-[3-bis(2-hydroxyethyl)aminopropyl]acrylamide, N-(1,1-dimethyl-2-dimethylaminoethyl)acrylamide, N-(2-methyl-2-phenyl-3-dimethylaminopropyl)acrylamide, N-(2,2-dimethyl-3-dimethylaminopropyl)acrylamide, N-(2-morpholinoethyl)acrylamide, N-(2-amino-1,2-dicyanoethyl)acrylamide, etc.; N-monoalkenylacrylamides such as N-allylacrylamide, etc.; N-monoalkynylacrylamides such as N-(1,1-dimethylpropynyl)acrylamide, etc.; aromatic group-containing acrylamides such as N-phenylacrylamide, N-benzylacrylamide, N-[4-(phenylamino)phenyl]acrylamide, etc.; N-monoalkylolacrylamides such as N-methylolacrylamide, N-ethylolacrylamide, N-propylolacrylamide, etc.; N-alkoxyalkylacrylamides such as N-methoxymethylacrylamide, N-ethoxymethylacrylamide, N-butoxymethylacrylamide, N-isobutoxymethylacrylamide, etc.; N-alkoxyacrylamides such as N-methoxyacrylamide, N-ethoxyacrylamide, N-propoxyacrylamide, N-butoxyacrylamide, etc.; N-acetylacrylamide; N-diacetoneacrylamide; N-monoalkylmethacrylamides such as N-methylmethacrylamide, N-ethylmethacrylamide, N-propylmethacrylamide, N-isopropylmethacrylamide, N-butylmethacrylamide, N-isobutylmethacrylamide, N-tert-butylmethacrylamide, N-heptylmethacrylamide, N-octylmethacrylamide, N-tert-octylmethacrylamide, N-dodecylmethacrylamide, N-octadecylmethacrylamide, etc.; substituted N-monoalkylmethacrylamides such as N-(2-hydroxyethyl)methacrylamide, N-(1,1-dimethyl-2-hydroxyethyl)methacrylamide, N-(1-ethyl-hydroxyethyl)methacrylamide, N-(2-chloroethyl)methacrylamide, N-(2,2,2-trichloro-1-hydroxyethyl)methacrylamide, N-(2-dimethylaminoethyl)methacrylamide, N-(3-dimethylaminopropyl)methacrylamide, N-[3-bis(2-hydroxyethyl)aminopropyl]methacrylamide, N-(1,1-dimethyl-2-dimethylaminoethyl)methacrylamide, N-(2-methyl-2-phenyl-3-dimethylaminopropyl)methacrylamide, N-(2,2-dimethyl-3-dimethylaminopropyl)methacrylamide, N-(2-morpholinoethyl)methacrylamide, N-(2-amino-1,2-dicyanoethyl)methacrylamide, etc.; N-monoalkenylmethacrylamides such as N-allylmethacrylamide, etc.; N-monoalkynylmethacrylamides such as N-(1,1-dimethylpropynylmethacrylamide, etc.; aromatic group-containing methacrylamides such as N-phenylmethacrylamide, N-benzylmethacrylamide, N-[4-(phenylamino)phenyl]methacrylamide, etc.; N-monoalkylolmethacrylamides such as N-methylolmethacrylamide, N-ethylolmethacrylamide, N-propylolmethacrylamide, etc.; N-alkoxyalkylmethacrylamides such as N-methoxymethylmethacrylamide, N-ethoxymethylmethacrylamide, N-butoxymethylmethacrylamide, N-isobutoxymethylmethacrylamide, etc.; N-alkoxymethacrylamides such as N-methoxymethacrylamide, N-ethoxymethacrylamide, N-propoxymethacrylamide, N-butoxymethacrylamide, etc.; N-acetylmethacrylamide; N-diacetonemethacrylamide; and the like.

The N-mono-substituted derivative can also be a dialkylaminoalkyl(meth)acrylamide, such as N,N-dimethylaminoethylacrylamide, N,N-diethylaminoethylacrylamide, N,N-dimethylaminopropylacrylamide, N,N-diethylaminopropylacrylamide, N,N-dimethylaminoethylmethacrylamide, N,N-diethylaminoethylmethacrylamide, N,N-dimethylaminopropylmethacrylamide, N,N-diethylaminopropylmethacrylamide, etc.; or the like.

Specific examples of the N,N-di-substituted derivative include N,N-dialkylacrylamides such as N,N-dimethylacrylamide, N,N-diethylacrylamide, N,N-dipropylacrylamide, N,N-diisopropylacrylamide, N,N-dibutylacrylamide, N,N-diisobutylacrylamide, N,N-di-tert-butylacrylamide, N,N-diheptylacrylamide, N,N-dioctylacrylamide, N,N-di-tert-octylacrylamide, N,N-didodecylacrylamide, N,N-dioctadecylacrylamide, etc.; substituted N,N-dialkylacrylamides such as N,N-bis(2-hydroxyethyl)acrylamide, N,N-bis(2-cyanoethyl)acrylamide, etc.; N,N-dialkenylacrylamides such as N,N-diallylacrylamide, etc.; aromatic group-containing acrylamides such as N,N-diphenylacrylamide, N,N-dibenzylacrylamide, etc.; N,N-dialkylolacrylamides such as N,N-dimethylolacrylamide, N,N-diethylolacrylamide, N,N-dipropylolacrylamide, etc.; N-alkoxy-N-alkylacrylamides such as N-methyl-N-methoxyacrylamide, N-methyl-N-ethoxyacrylamide, N-methyl-N-propoxyacrylamide, N-methyl-N-butoxyacrylamide, N-ethyl-N-methoxyacrylamide, N-ethyl-N-ethoxyacrylamide, N-ethyl-N-butoxyacrylamide, N-propyl-N-methoxyacrylamide, N-propyl-N-ethoxyacrylamide, N-butyl-N-methoxyacrylamide, N-butyl-N-ethoxyacrylamide, etc.; N,N-diacetylacrylamide; N,N-diacetoneacrylamide; N,N-dialkylmethacrylamides such as N,N-dimethylmethacrylamide, N,N-diethylmethacrylamide, N,N-dipropylmethacrylamide, N,N-diisopropylmethacrylamide, N,N-dibutylmethacrylamide, N,N-diisobutylmethacrylamide, N,N-di-tert-butylmethacrylamide, N,N-diheptylmethacrylamide, N,N-dioctylmethacrylamide, N,N-di-tert-octylmethacrylamide, N,N-didodecylmethacrylamide, N,N-dioctadecylmethacrylamide, etc.; substituted N,N-dialkylmethacrylamides such as N,N-bis(2-hydroxyethyl) methacrylamide, N,N-bis(2-cyanoethyl)methacrylamide, etc.; N,N-dialkenylmethacrylamides such as N,N-diallylmethacrylamide, etc.; aromatic group-containing methacrylamides such as N,N-diphenylmethacrylamide, N,N-dibenzylmethacrylamide, etc.; N,N-dialkylolmethacrylamides such as N,N-dimethylolmethacrylamide, N,N-diethylolmethacrylamide, N,N-dipropylolmethacrylamide, etc.; N-alkoxy-N-alkylmethacrylamides such as N-methyl-N-methoxymethacrylamide, N-methyl-N-ethoxymethacrylamide, N-methyl-N-propoxymethacrylamide, N-methyl-N-butoxymethacrylamide, N-ethyl-N-methoxymethacrylamide, N-ethyl-N-ethoxymethacrylamide, N-ethyl-N-butoxymethacrylamide, N-propyl-N-methoxymethacrylamide, N-propyl-N-ethoxymethacrylamide, N-butyl-N-methoxymethacrylamide, N-butyl-N-ethoxymethacrylamide, etc.; N,N-diacetylmethacrylamide; N,N-diacetonemethacrylamide; acryloylpiperidine; acryloylmorpholine; acryloylthiomorpholine; acryloylpyrrolidine; and the like. For the polymerizable monomer (a), solely one species or a combination of two or more species can be used.

The amide group-containing polymer is preferably nonionic. In other words, a polymer essentially free of anionic and cationic building units is preferable. Herein, being essentially free of anionic and cationic building units means that the molar ratio of these building units is lower than 0.02% (e.g. lower than 0.001%). By the use of a polishing composition comprising a nonionic amide group-containing polymer, the effect to reduce defects and haze can be preferably produced. While it is unnecessary to reveal the reasons for this, it can be thought that during polishing, when adsorbed onto the abrasive and silicon wafer to a suitable extent, the nonionic amide group-containing polymer contributes to haze reduction. The suitable extent of adsorption may also preferably reduce residual abrasive and polishing sludge in the cleaning step, thereby contributing to defect reduction.

The molecular weight of the amide group-containing polymer is not particularly limited. For instance, the amide group-containing polymer has a Mw typically below $40 \times 10^4$, preferably below $25 \times 10^4$, more preferably below $20 \times 10^4$, yet more preferably below $10 \times 10^4$, or particularly preferably below $5 \times 10^4$. The Mw of the amide group-containing polymer is typically $5 \times 10^3$ or larger. From the standpoint of haze reduction, etc., it is preferably $1 \times 10^4$ or larger, or more preferably $1.5 \times 10^4$ or larger.

When the amide group-containing polymer is an amide group-containing polymer that has, in its main chain, a building unit A derived from a monomer represented by the general formula (1) (e.g. a polymer with $R^2$ and $R^3$ in the general formula (1) being each an alkyl group with 1 to 8 carbon atoms or an alkylol group with 1 to 8 (e.g. 1 or 2) carbon atoms), from the standpoint of reducing defects and haze, its Mw is preferably below $5 \times 10^4$ (e.g. below $4 \times 10^4$, typically below $3 \times 10^4$). When the amide group-containing polymer has, in its main chain, a building unit A derived from a monomer represented by the general formula (2) or (3), its Mw is, for instance, below $40 \times 10^4$, preferably below $25 \times 10^4$, more preferably below $20 \times 10^4$, or yet more preferably below $10 \times 10^4$.

The relationship between the weight average molecular weight (Mw) and number average molecular weight (Mn) of the amide group-containing polymer is not particularly limited. From the standpoint of preventing aggregate formation, etc., for instance, a water-soluble polymer having a molecular weight distribution (Mw/Mn) of 5.0 or lower can be preferably used. From the standpoint of the consistency of performance of the polishing composition, etc., the Mw/Mn of the amide group-containing polymer is preferably 4.0 or lower, more preferably 3.5 or lower, or yet more preferably 3.0 or lower (e.g. 2.5 or lower).

Theoretically, the Mw/Mn is 1.0 or higher. From the standpoint of the availability of starting materials and ease of synthesis, usually, an amide group-containing polymer having an Mw/Mn of 1.05 or higher can be preferably used.

As the Mw and Mn of an amide group-containing polymer, the values based on aqueous gel permeation chromatography (GPC) (aqueous, based on standard polyethylene oxide) can be used.

It is preferable that the amide group-containing polymer disclosed herein consists essentially of the building unit A. In other words, in the amide group-containing polymer, the ratio (molar ratio) of number of moles of building unit A to number of moles of all building units in the molecular structure of the polymer is preferably 99% by mole or higher (e.g. 99.9% by mole or higher, typically 99.9 to 100% by mole). Preferable examples of such polymer include a homopolymer formed of one species of polymerizable monomer (a) disclosed herein and a copolymer formed of two or more species of polymerizable monomer (a).

As far as the effect of the invention is not significantly impaired, the amide group-containing polymer disclosed herein may be a copolymer comprising a building unit (or "building unit B" hereinafter) derived from one, two or more species of monomer (b) that is copolymerizable with the polymerizable monomer (a). The building unit B is by definition different from the building unit A. The building unit B may be free of a secondary amide group and a tertiary amide group. The building unit B content (molar ratio) in the amide group-containing polymer can be less than 50% by mole (e.g. less than 30% by mole, typically less than 10% by mole).

The "% by mole" is the molar ratio determined by counting a certain building unit derived from a single monomer (encompassing the polymerizable monomer (a) and monomer (b)) as one molecule. Accordingly, the proportions of the building units A and B may correspond to the molar ratios of polymerizable monomer (a) and monomer (b) relative to all monomers used in the polymerization, respectively.

<Adsorption Ratio>

The amide group-containing polymer disclosed herein preferably has an adsorption ratio of 10% to 80% in the following adsorption ratio measurement. This can inhibit aggregation of the abrasive and allows adjustment of the work of the abrasive to mechanically polish a silicon wafer. It reduces aggregates of polishing sludge and the abrasive formed during polishing and increases the washability of a silicon wafer surface after polished. The adsorption ratio is preferably 10% to 70% (e.g. 10 to 60%, typically 15 to 50%).

The adsorption ratio is measured as described below. More specifically, for instance, the adsorption ratio of the amide group-containing polymer can be determined in the same manner as the adsorption ratio measurement described later in the working examples.

[Adsorption Ratio Measurement]

(1) A test solution L0 is obtained, comprising 0.018% by mass of a measured polymer and 0.01% by mass of ammonia with the rest being water.

(2) A test solution L1 is obtained, comprising 0.46% by mass of the abrasive as well as 0.018% by mass of the polymer being measured and 0.01% by mass of ammonia with the rest being water.

(3) The test solution L1 is centrifuged to precipitate the abrasive.

(4) From the mass W0 of the measured polymer in the test solution L0 and mass W1 of the measured polymer in the supernatant of the centrifuged test solution L1, the adsorption ratio of the measured polymer is determined by the next equation:

Adsorption ratio (%)=[($W0-W1$)/$W0$]×100

The centrifugation can be carried out at a rotational speed of 20000 rpm for 30 minutes, using, for instance, a centrifuge under model name "AVANTI HP-30I" available from Beckman Coulter, Inc. The mass W0 of the measured polymer in the test solution L0 and mass W1 of the measured polymer in the supernatant of the centrifuged test solution L1 can be determined by measuring the total organic carbons (TOC) in the test solution L1 and the supernatant. TOC can be measured, for instance, using a TOC analyzer (combustion catalytic oxidation method, model name "TOC-5000A") available from Shimadzu Corporation or a similar product.

As the abrasive used for measurement of the adsorption ratio of a polymer of interest, it is desirable to use the same abrasive (e.g. an abrasive of the same material, particle diameters and particle shape) as the abrasive in the polishing composition that contains the polymer of interest. When measuring the adsorption ratio of an amide group-containing polymer in a rinse composition described later, it is desirable to carry out the measurement, using the same abrasive as the abrasive in the polishing composition used in a polishing step prior to a rinsing step using the rinse composition or the same abrasive as the abrasive in the polishing composition used in a polishing step after a rinsing step. However, in view of practical convenience, the adsorption ratio may be measured using an abrasive different from the one used in the polishing composition as far as no large difference occurs in adsorption ratio when compared with the adsorption ratio value measured using the abrasive used in the polishing composition (e.g. as far as the adsorption ratio of the measured polymer is clearly higher or lower than 10% regardless of which abrasive is used). For instance, an abrasive made of the same material as the abrasive used in the polishing composition, but in slightly different particle size and shape (e.g. different in one, two or more characteristic values among average primary particle diameter, average secondary particle diameter, size distribution, aspect ratio, specific surface area, etc.) can be used. It is usually suitable to measure the adsorption ratio, using an abrasive made of the same type of material with approximately the same specific surface area as the abrasive used in the polishing composition (e.g. within a ±10% difference in specific surface area relative to the abrasive forming the polishing composition).

The art disclosed herein can be preferably applied to, but not particularly limited to, a polishing composition using an abrasive having a specific surface area of about 20 $mm^2/g$ to 200 $mm^2/g$ (typically 50 $mm^2/g$ to 150 $mm^2/g$).

<Water>

The polishing composition disclosed herein typically comprises water in addition to the amide group-containing polymer. As the water, ion-exchanged water (deionized water), pure water, ultrapure water, distilled water and the like can be preferably used. To avoid hindering the effects of other components in the polishing composition whenever possible, in the water used, for instance, the total transition metal ion content is preferably 100 ppb or less. For example, the purity of the water can be increased by operations such as removing impurity ions with ion-exchange resin, removing contaminants with a filter, distillation, and so on.

The polishing composition disclosed herein may further comprise, as necessary, a water-miscible organic solvent (lower alcohol, lower ketone, etc.). In usual, of the solvent in the polishing composition, preferably 90% by volume or more is water, or more preferably 95% by volume or more (typically 99 to 100% by volume) is water.

The polishing composition disclosed herein (typically a slurry composition) can be preferably made, for instance, in an embodiment in which the non-volatile content (NV) is 0.01% by mass to 50% by mass and the rest is an aqueous solvent (water or a mixture of water and the organic solvent) or in an embodiment where the rest is an aqueous solvent and a volatile compound (e.g. ammonia). An embodiment wherein the NV is 0.05% by mass to 40% by mass is more preferable. The non-volatile content (NV) refers to the mass proportion of residue remaining in the polishing composition after drying the polishing composition at 105° C. for 24 hours.

<Abrasive>

The polishing composition disclosed herein is used in the presence of an abrasive. The abrasive serves to mechanically polish a silicon wafer surface. In the polishing composition disclosed herein, the abrasive also serves to rub the amide group-containing polymer adsorbed on the abrasive surface against a silicon wafer or serves to take up the amide group-containing polymer adsorbed on the silicon wafer. By this, chemical polishing by means of the silicon wafer polishing accelerator is adjusted. In this description, the "polishing composition being used in the presence of an abrasive" may encompass an embodiment where the abrasive is contained in the polishing composition. Such an embodiment is considered as a preferable embodiment of the polishing composition disclosed herein. Accordingly, the "polishing composition being used in the presence of an abrasive" can be rephrased as the "polishing composition comprising an abrasive." Alternatively, the abrasive can be used, for instance, as a fixed abrasive integrated in a polishing pad.

The material and properties of the abrasive disclosed herein are not particularly limited and can be suitably selected in accordance with the purpose and application of the polishing composition, etc. Examples of the abrasive include inorganic grains, organic grains and organic/inorganic composite grains. Specific examples of inorganic grains include oxide grains such as silica grains, alumina grains, cerium oxide grains, chromium oxide grains, titanium dioxide grains, zirconium oxide grains, magnesium oxide grains, manganese dioxide grains, zinc oxide grains, red oxide grains, etc.; nitride grains such as silicon nitride grains, boron nitride grains, etc.; carbide grains such as silicon carbide grains, boron carbide grains, etc.; diamond grains; carbonates such as calcium carbonate, barium carbonate, etc.; and the like. Specific examples of organic grains include polymethyl methacrylate (PMMA) grains, poly(meth)acrylic acid grains (herein the (meth)acrylic acid comprehensively means acrylic acid and methacrylic acid), polyacrylonitrile grains, and the like. These abrasives can be used singly as one species or in a combination of two or more species.

As the abrasive, inorganic grains are preferable. In particular, grains of an oxide of a metal or metalloid are preferable. Preferable examples of the abrasive that can be used in the art disclosed herein include silica grains. A reason for this is that when silica grains formed of oxygen atoms and the same element as the polished article (silicon wafer) are used, metal or metalloid residues different from silicon will not be generated after the polishing, eliminating risks such as contamination of the silicon wafer surface and degradation of electrical properties of the silicon wafer caused by dispersion of metal or metalloid residues that are not silicon in the polished article. An example of an embodiment of the polishing composition preferable from such a standpoint is a polishing composition consisting of silica grains as the abrasive. By nature, silica can be readily obtained in a highly pure state. This is also one of the reasons that silica grains are preferable as the abrasive. Specific examples of silica grains include colloidal silica, fumed silica, precipitated silica and the like. From the standpoint of the less likelihood of scratching the article surface and capability of making a surface with lower haze, colloidal silica and fumed silica are cited as preferable silica grains. Colloidal silica is particularly preferable. In particular, colloidal silica is preferably used as the abrasive in the polishing composition used for polishing (especially, final polishing) of a silicon wafer.

The silica constituting the silica grains has a true specific gravity of preferably 1.5 or higher, more preferably 1.6 or higher, or yet more preferably 1.7 or higher. With increasing true specific gravity of the silica, the polishing rate (amount of surface removed from article surface per unit time) may increase when polishing a silicon wafer. From the standpoint of reducing scratches occurring in the surface (polished surface) of the article, preferable silica grains have a true specific gravity of 2.2 or lower. As the true specific gravity of the silica, the value measured by a liquid displacement method using ethanol as the displacing liquid can be used.

In the art disclosed herein, the abrasive in the polishing composition can be in a form of primary particles or in a form of secondary particles which are aggregates of primary particles. Alternatively, the abrasive may be present both in the primary particle form and secondary particle form. In a preferable embodiment, the abrasive is present at least partially in a secondary particle form in the polishing composition.

The abrasive's average primary particle diameter $D_{P1}$ is not particularly limited. From the standpoint of the polishing efficiency, etc., the average primary particle diameter $D_{P1}$ is preferably 5 nm or larger, or more preferably 10 nm or larger. From the standpoint of obtaining greater effects of polishing (e.g. effects such as reduced haze, removal of defects, etc.), the average primary particle diameter $D_{P1}$ is preferably 15 nm or larger, more preferably 20 nm or larger (e.g. larger than 20 nm). From the standpoint of the likelihood of yielding a highly smooth surface, the abrasive has an average primary particle diameter $D_{P1}$ of preferably 100 nm or smaller, more preferably 50 nm or smaller, or yet more preferably 40 nm or smaller. From the standpoint of the likelihood of obtaining a higher-quality surface (e.g. a surface with reduced defect such as LPD (light point defect), PID (polishing induced defect), etc.), the art disclosed herein can also be preferably implemented in an embodiment using an abrasive having an average primary particle diameter $D_{P1}$ of 35 nm or smaller (more preferably 32 nm or smaller, e.g. smaller than 30 nm).

In the art disclosed herein, the abrasive's average primary particle diameter $D_{P1}$ can be determined, for instance, from the specific surface area S ($m^2/g$) measured by the BET method, based on the equation for the average primary particle diameter $D_{P1}$ (nm)=2727/S. The abrasive's specific surface area can be measured by using, for instance, a surface area analyzer under trade name "FLOW SORB II 2300" available from Micromeritics.

The abrasive's average secondary particle diameter $D_{P2}$ is not particularly limited. From the standpoint of the polishing rate, etc., it is preferably 10 nm or larger, or more preferably 20 nm or larger. From the standpoint of obtaining greater effects of polishing, the average secondary particle diameter $D_{P2}$ is preferably 30 nm or larger, more preferably 35 nm or larger, or yet more preferably 40 nm or larger (e.g. larger than 40 nm). From the standpoint of yielding a highly smooth surface, the abrasive has an average secondary particle diameter $D_{P2}$ of suitably 200 nm or smaller, preferably 150 nm or smaller, or more preferably 100 nm or smaller. From the standpoint of the likelihood of obtaining a higher-quality surface (e.g. a surface with reduced defect such as LPD, PID, etc.), the art disclosed herein can also be preferably practiced in an embodiment using an abrasive having an average secondary particle diameter $D_{P2}$ of smaller than 70 nm (more preferably 60 nm or smaller, e.g. smaller than 50 nm).

The abrasive's average secondary particle diameter $D_{P2}$ can be measured for an aqueous dispersion of the abrasive of interest as a measurement sample by dynamic light scattering using, for instance, model "UPA-UT151" available from Nikkiso Co., Ltd.

The abrasive's average secondary particle diameter $D_{P2}$ is generally equal to or larger than the abrasive's average primary particle diameter $D_{P1}$ ($D_{P2}/D_{P1} \geq 1$) and is typically larger than $D_{P1}$ ($D_{P2}/D_{P1} > 1$). Although not particularly limited, from the standpoint of the effects of polishing and post-polishing surface smoothness, $D_{P2}/D_{P1}$ of the abrasive is usually suitably in a range of 1.2 to 3, preferably in a range of 1.5 to 2.5, or more preferably in a range of 1.7 to 2.3 (e.g. greater than 1.9, but 2.2 or less).

The abrasive grain's shape (external shape) may be globular or non-globular. Specific examples of non-globular shapes of the abrasive include a peanut shape (i.e. peanut shell shape), cocoon shape, confeito shape (spikey ball shape), rugby ball shape, and so on. For instance, the abrasive mostly comprising peanut-shaped grains can be preferably used.

The abrasive has, but not particularly limited to, an average value of primary particle's major axis/minor axis ratio (average aspect ratio) of preferably 1.05 or higher, more preferably 1.1 or higher. With increasing average aspect ratio of the abrasive, a higher polishing rate can be obtained. From the standpoint of scratch reduction and so on, the abrasive's average aspect ratio is preferably 3.0 or lower, more preferably 2.0 or lower, or yet more preferably 1.5 or lower.

The abrasive's shape (external shape) and average aspect ratio can be assessed, for instance by electron microscope observations. In specific procedures for determining the average aspect ratio, for instance, using a scanning electron microscope (SEM), with respect to a prescribed number (e.g. 200) of abrasive grains having observable separate shapes, the smallest circumscribing rectangles are drawn on the respective grain images. With respect to the rectangle drawn on each grain image, the long side length (major axis length) is divided by the short side length (minor axis length) to determine the major axis/minor axis ratio (aspect ratio). The aspect ratios of the prescribed number of grains can be arithmetically averaged to determine the average aspect ratio.

<Silicon Wafer Polishing Accelerator>

The polishing composition disclosed herein typically comprises a silicon wafer polishing accelerator in addition to an amide group-containing polymer and water. The silicon wafer polishing accelerator is a component that is added to the polishing composition to chemically polish a surface to be polished and thereby to contribute to increase the polishing rate. The silicon wafer polishing accelerator has an effect to chemically etch silicon and it typically is a basic compound. A basic compound contained in a polishing composition increases the pH of the polishing composition and improve the state of dispersion of the abrasive and amide group-containing polymer; and therefore, it may help increase the dispersion stability of the polishing composition or enhance the mechanical polishing work of the abrasive.

As the basic compound, organic or inorganic nitrogen-containing basic compounds, hydroxides of alkali metals or alkaline earth metals, various carbonates and hydrogen carbonates, etc., can be used. Examples include alkali metal hydroxides; quaternary ammonium hydroxides and salts thereof ammonia; amines; and the like. Specific examples of alkali metal hydroxides include potassium hydroxide, sodium hydroxide, etc. Specific examples of carbonates and hydrogen carbonates include ammonium hydrogen carbonate, ammonium carbonate, potassium hydrogen carbonate, potassium carbonate, sodium hydrogen carbonate, sodium carbonate, etc. Specific examples of quaternary ammonium hydroxides or salts thereof include such as tetramethylammonium hydroxide, tetraethylammonium hydroxide, tetrabutylammonium hydroxide, etc. Specific examples of amines include methylamine, dimethylamine, trimethylamine, ethylamine, diethylamine, triethylamine, ethylenediamine, monoethanolamine, N-(β-aminoethyl)ethanolamine, hexamethylenediamine, diethylenetriamine, triethylenetetraamine, anhydrous piperazine, piperazine hexahydrate, 1-(2-aminoethyl)piperazine, N-methylpiperazine, guanidine, azoles such as imidazole, triazole, etc., and the like. These basic compounds can be used singly as one species or in a combination of two or more species.

Examples of basic compounds preferable from the standpoint of increasing the polishing rate, etc., include ammonia, potassium hydroxide, sodium hydroxide, tetramethylammonium hydroxide, tetraethylammonium hydroxide, ammonium hydrogen carbonate, ammonium carbonate, potassium hydrogen carbonate, potassium carbonate, sodium hydrogen carbonate and sodium carbonate. In particular, preferable examples include ammonia, potassium hydroxide, sodium hydroxide, tetramethylammonium hydroxide and tetraethylammonium hydroxide. As more preferable species, ammonia and tetramethylammonium hydroxide are cited. An especially preferable basic compound is ammonia.

<Surfactant>

The polishing composition disclosed herein can be preferably made in an embodiment comprising a surfactant (typically a water-soluble organic compound having a molecular weight below $1 \times 10^4$). The use of surfactant may increase the dispersion stability of the polishing composition. It may facilitate the reduction of haze. For the surfactant, solely one species or a combination of two or more species can be used.

As the surfactant, anionic or nonionic kinds can be preferably used. From the standpoint of the low-foaming properties and easy pH adjustment, nonionic surfactants are more preferable. Examples include oxyalkylene polymers such as polyethylene glycol, polypropylene glycol, polytetramethylene glycol, etc.; polyoxyalkylene adducts such as polyoxyethylene alkyl ether, polyoxyethylene alkyl phenyl ether, polyoxyethylene alkylamine, polyoxyethylene fatty acid esters, polyoxyethylene glyceryl ether fatty acid esters, polyoxyethylene sorbitan fatty acid esters, etc.; copolymers (diblocks, triblocks, random-type, alternating-type) of several species of oxyalkylene; and the like.

Specific examples of nonionic surfactant include a block copolymer of ethylene oxide (EO) and propylene oxide (PO) (diblock, PEO(polyethylene oxide)-PPO(polypropylene oxide)-PEO triblock, PPO-PEO-PPO triblock, etc.), a random copolymer of EO and PO, polyoxyethylene glycol, polyoxyethylene propyl ether, polyoxyethylene butyl ether, polyoxyethylene pentyl ether, polyoxyethylene hexyl ether, polyoxyethylene octyl ether, polyoxyethylene 2-ethylhexyl ether, polyoxyethylene nonyl ether, polyoxyethylene decyl ether, polyoxyethylene isodecyl ether, polyoxyethylene tridecyl ether, polyoxyethylene lauryl ether, polyoxyethylene cetyl ether, polyoxyethylene stearyl ether, polyoxyethylene isostearyl ether, polyoxyethylene oleyl ether, polyoxyethylene phenyl ether, polyoxyethylene octyl phenyl ether, polyoxyethylene nonyl phenyl ether, polyoxyethylene dodecyl phenyl ether, polyoxyethylene styrenated phenyl ether, polyoxyethylene laurylamine, polyoxyethylene stearylamine, polyoxyethylene oleylamine, polyoxyethylene stearylamide, polyoxyethylene oleylamide, polyoxyethylene monolaurate, polyoxyethylene monostearate, polyoxyethylene distearate, polyoxyethylene monooleate, polyoxyethylene dioleate, polyoxyethylene sorbitan monolaurate, polyoxyethylene sorbitan monopalmitate, polyoxyethylene sorbitan monostearate, polyoxyethylene sorbitan monooleate, polyoxyethylene sorbitan trioleate, polyoxyethylene sorbitol tetraoleate, polyoxyethylene castor oil, polyoxyethylene hardened castor oil, and the like. Particularly preferable surfactants include a block copolymer of EO and PO (especially a PEO-PPO-PEO triblock), a random copolymer of EO and PO, and polyoxyethylene alkyl ether (e.g. polyoxyethylene decyl ether).

The surfactant typically has a molecular weight below $1 \times 10^4$. From the standpoint of the ease of filtering the polishing composition and cleaning the polished article, the surfactant's molecular weight is preferably 9500 or smaller. The molecular weight of the surfactant is typically 200 or larger. From the standpoint of haze reduction effect, etc., the surfactant's molecular weight is preferably 250 or larger, or more preferably 300 or larger (e.g. 500 or larger). As the molecular weight of the surfactant, the weight average molecular weight (Mw) determined by GPC (aqueous, based on standard polyethylene glycol) or the molecular weight determined from the chemical formula can be used.

More preferable molecular weight ranges of the surfactant may also vary depending on the type of surfactant. For instance, when a block copolymer of EO and PO is used as the surfactant, its Mw is preferably 1000 or larger, more preferably 2000 or larger, or yet more preferably 5000 or larger.

<Optional Polymers>

In addition to the amide group-containing polymer described above, the polishing composition disclosed herein may further comprise, as necessary, another water-soluble polymer (or an "optional polymer" hereinafter) different from the amide group-containing polymer. The type of such optional polymer is not particularly limited. A suitable species can be selected among water-soluble polymers known in the field of polishing compositions.

The optional polymer may have, in its molecule, at least one species of functional group selected among cationic groups, anionic groups and nonionic groups. The optional polymer may have, in its molecule, a hydroxyl group, carboxyl group, acyloxy group, sulfo group, primary amide structure, quaternary nitrogen structure, heterocyclic structure, vinyl structure, polyoxyalkylene structure, etc. From the standpoint of reducing aggregates or increasing the washability, etc., a nonionic polymer can be preferably used as the optional polymer.

Preferable examples of the optional polymer in the polishing composition disclosed herein include an oxyalkylene group-containing polymer, nitrogen atom-containing polymer, polyvinyl alcohol, and the like.

Examples of an oxyalkylene group-containing polymer include a PEO, a block copolymer of EO and PO, a random copolymer of EO and PO, and the like. The block copolymer of EO and PO can be a diblock, triblock or the like, comprising a PEO block and a PPO block. Examples of the triblock include a PEO-PPO-PEO triblock and PPO-PEO-PPO triblock. Usually, a PEO-PPO-PEO triblock is more preferable.

In the block or random copolymer of EO and PO, from the standpoint of the water solubility and washability, etc., the molar ratio (EO/PO) between EO and PO constituting the copolymer is preferably higher than 1, more preferably 2 or higher, or yet more preferably 3 or higher (e.g. 5 or higher).

As the nitrogen atom-containing polymer, either a polymer containing nitrogen atoms in the main chain or a polymer having a nitrogen atom in a side chain functional group (pendant group) can be used. Examples of the polymer having a nitrogen atom in the main chain include a homopolymer and a copolymer of an N-acylalkyleneimine-based monomer. Specific examples of the N-acylalkyleneimine-based monomer include N-acetylethyleneimine, N-propionylethyleneimine, etc. Examples of a polymer having a nitrogen atom in an pendant group include a polymer comprising an N-vinyl monomeric unit, etc. For instance, a homopolymer and a copolymer of N-vinylpyrrolidone, etc., can be used.

When a polyvinyl alcohol is used as an optional polymer, the degree of saponification of the polyvinyl alcohol is not particularly limited.

Other examples of the optional polymer that can be contained in the polishing composition disclosed herein include cellulose derivatives such as hydroxyethyl cellulose, hydroxypropyl cellulose, hydroxyethyl methylcellulose, hydroxypropyl methylcellulose, methylcellulose, ethylcellulose, ethylhydroxyethyl cellulose, carboxymethyl cellulose, etc.; and pullulan.

The molecular weight and the molecular weight distribution (Mw/Mn) of the optional polymer are not particularly limited. For example, the preferable Mw and molecular weight distribution of the aforementioned amide group-containing polymer can be also applied to the Mw and molecular weight distribution of the optional polymer.

The optional polymer is used in an amount of suitably 50% by mass or less of the total amount of water-soluble polymer components with Mw of $1 \times 10^4$ or larger (including the aforementioned amide group-containing polymer and optional polymers used as necessary), preferably 30% by mass or less, or more preferably 15% by mass or less (e.g. 10% by mass or less). The polishing composition disclosed herein can be preferably made in an embodiment essentially free of optional polymers (e.g. the optional polymer content in the total amount of water-soluble polymer components is less than 1% by mass or non-detectable).

When the polishing composition disclosed herein comprises a cellulose derivative as an optional polymer, its amount used is preferably as low as or lower than 10% by mass of the total amount of water-soluble polymer components with Mw of $1 \times 10^4$ or larger in the polishing composition, or more preferably 5% by mass or less (typically 1% by mass or less). By this, inclusion of contamination and aggregation caused by the use of a natural compound-derived cellulose derivative can be reduced to a greater extent. The polishing composition disclosed herein can be preferably made, for instance, in an embodiment essentially free of a cellulose derivative (e.g. the cellulose derivative content in the total amount of the water-soluble polymer components is less than 1% by mass or non-detectable).

<Other Components>

As far as the effects by the present invention are not significantly hindered, the polishing composition disclosed herein may further comprise as necessary known additives, such as chelating agents, organic acids, organic acid salts, inorganic acids, inorganic acid salts, preservatives, antifungal agents, and so on, which can be used in polishing compositions (typically, polishing compositions used for final polishing of silicon wafers).

Examples of chelating agents include aminocarboxylic acid-based chelating agents and organophosphonic acid-based chelating agents. Examples of aminocarboxylic acid-based chelating agents include ethylenediamine tetraacetic acid, ethylenediamine tetraacetic acid sodium salt, nitrilotriacetic acid, nitrilotriacetic acid sodium salt, nitrilotriacetic acid ammonium salt, hydroxyethylethylenediamine triacetic acid, hydroxyethylethylenediamine triacetic acid sodium salt, diethylenetriamine pentaacetic acid, diethylenetriamine pentaacetic acid sodium salt, triethylenetetramine hexaacetic acid, and triethylenetetramine hexaacetic acid sodium salt. Examples of organophosphonic acid-based chelating agents include 2-aminoethylphosphonic acid, 1-hydroxyethylidene-1,1-diphosphonic acid, aminotri(methylenephosphonic acid), ethylenediaminetetrakis(methylenephosphonic acid), diethylenetriaminepenta(methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxyphosphonic acid, 2-phosphonobutane-1,2-dicarboxylic acid, 1-phosphonobutane-2,3,4-tricarboxylic acid, and α-methylphosphonosuccinic acid. Among them, organophosphonic acid-based chelating agents are preferable, with ethylenediaminetetrakis(methylenephosphonic acid) and diethylenetriaminepenta(methylenephosphonic acid) being more preferable. A particularly preferable chelating agent is ethylenediaminetetrakis(methylenephosphonic acid).

Examples of organic acids include formic acid; aliphatic acids such as acetic acid, propionic acid, etc.; aromatic carboxylic acids such as benzoic acid, phthalic acid, etc.; as well as citric acid, oxalic acid, tartaric acid, malic acid, maleic acid, fumaric acid, succinic acid, organic sulfonic acids, organic phosphoric acids, and the like. Examples of organic acid salts include alkali metal salts (sodium salts, potassium salts, etc.), ammonium salts and the like of organic acids. Examples of inorganic acids include sulfuric acid, nitric acid, hydrochloric acid, carbonic acid, etc. Examples of inorganic acid salts include alkali metal salts (sodium salts, potassium salts, etc.) and ammonium salts of inorganic acids. The organic acids and their salts as well as inorganic acids and their salts can be used singly as one species or in a combination of two or more species.

Examples of preservatives and antifungal agents include isothiazoline-based compounds, paraoxybenzoic acid esters, phynoxyethanol, etc.

<Applications>

The polishing composition disclosed herein is used for polishing a polishing object (silicon wafer) formed of monocrystalline silicon. The shape of the article is not particularly limited. The polishing composition disclosed herein can be preferably applied for polishing an article having a flat surface such as a plate, polyhedron, etc.

The polishing composition disclosed herein can be preferably used for final polishing of an article. Accordingly, this description provides a polished article production method (e.g. silicon wafer production method) comprising a final polishing step using the polishing composition. The final polishing refers to the last polishing step (i.e. a step after which no further polishing is performed) in a production process of an article of interest. The polishing composition disclosed herein may be used in an earlier polishing step than final polishing (referring to a preliminary polishing step between the rough polishing step and final polishing step, typically including at least a first polishing step and possibly second, third . . . polishing steps). For instance, the polishing composition disclosed herein can be used in a polishing step performed immediately before final polishing.

The polishing composition disclosed herein can be particularly preferably used for polishing a silicon wafer. For instance, it is preferable as a polishing composition used in final polishing of a silicon wafer or in an earlier polishing step than this. For instance, it is effectively applied for polishing (typically final polishing or polishing just before this) of a silicon wafer prepared into a surface state having a surface roughness of 0.01 nm to 100 nm in an earlier step. It is particularly preferably applied to final polishing.

<Polishing Liquid>

The polishing composition disclosed herein is supplied to an article, typically in a form of a polishing liquid comprising the polishing composition, and used for polishing the article. The polishing liquid may be prepared, for instance, by diluting (typically with water) a polishing composition disclosed herein. Alternatively, the polishing composition can be used straight as a polishing liquid. In other words, the concept of polishing composition in the art disclosed herein encompasses both a polishing liquid (working slurry) supplied to an article and used for polishing the article and a concentrate (stock solution of polishing liquid) which is diluted for use as a polishing liquid. Other examples of the polishing liquid comprising the polishing composition disclosed herein include a polishing liquid obtained by adjusting the pH of the composition.

The amide group-containing polymer content in the polishing liquid is not particularly limited. For instance, it can be $1 \times 10^{-4}$% by mass or higher. From the standpoint of haze reduction, etc., the polymer content is preferably $5 \times 10^{-4}$% by mass or higher, or more preferably $1 \times 10^{-3}$% by mass or higher, for instance, $2 \times 10^{-3}$% by mass or higher. From the standpoint of the polishing rate, etc., the polymer content is preferably 0.2% by mass or lower, or more preferably 0.1% by mass or lower (e.g. 0.05% by mass or lower).

When the polishing composition disclosed herein comprises an abrasive, the abrasive content in the polishing liquid is not particularly limited. It is typically 0.01% by mass or higher, preferably 0.05% by mass or higher, or more preferably 0.1% by mass or higher, for instance, 0.15% by mass or higher. With increasing abrasive content, a higher polishing rate can be obtained. From the standpoint of obtaining a surface with lower haze, usually, the abrasive content is suitably 10% by mass or lower, preferably 7% by mass or lower, more preferably 5% by mass or lower, or yet more preferably 2% by mass or lower, for instance, 1% by mass or lower.

The silicon wafer polishing accelerator content in the polishing liquid disclosed herein is not particularly limited. From the standpoint of increasing the polishing rate, etc., usually, the basic compound content is preferably 0.001% by mass or more of the polishing liquid, or more preferably 0.003% by mass or more. From the standpoint of haze reduction, etc., the basic compound content is preferably below 0.4% by mass, or more preferably below 0.25% by mass.

The lower pH limit of the polishing liquid is preferably 8.0 or higher, more preferably 9.0 or higher, or yet more preferably 9.5 or higher. When the polishing liquid's pH is 8.0 or higher (more preferably 9.0 or higher, or yet more preferably 9.5 or higher), the rate of polishing a silicon wafer will increase and a silicon wafer with a highly smooth surface can be obtained efficiently. The dispersion stability of particles in the polishing liquid also increases. While the upper pH limit of the polishing liquid is not particularly limited, it is preferably 12.0 or lower, or yet more preferably 11.0 or lower. A pH of the polishing liquid of 12.0 or lower (or more preferably 11.0 or lower) can prevent dissolution of the abrasive (especially silica grains such as colloidal silica, fumed silica, precipitated silica, etc.) in the polishing liquid by the basic compound and inhibit degradation of the mechanical polishing work of the abrasive. The pH can be adjusted, for instance, by the organic acid or inorganic acid among the other components described above as well as by the basic compounds. The pH can be preferably applied to a polishing liquid used for polishing a silicon wafer (e.g. a polishing liquid for use in final polishing). The polishing liquid's pH can be obtained as follows: Using a pH meter (e.g. a glass electrode proton concentration meter (model number F-23) available from Horiba, Ltd.) and standard buffer solutions (a phthalate pH buffer solution at pH 4.01 (25° C.), a neutral phosphate pH buffer solution at pH 6.86 (25° C.), a carbonate pH buffer solution at pH 10.01 (25° C.)), after three-point correction, the glass electrode is immersed in the polishing liquid; and the stabilized value after two minutes or more is measured.

When the polishing composition disclosed herein comprises a surfactant, the surfactant content in the polishing liquid is not particularly limited. For instance, it can be $1 \times 10^{-4}$% by mass or higher. From the standpoint of haze reduction, etc., a preferable surfactant content is $5 \times 10^{-4}$% by mass or higher, or more preferably $1 \times 10^{-3}$% by mass or higher, for instance, $2 \times 10^{-3}$% by mass or higher. From the standpoint of the washability, polishing rate, etc., the surfactant content is preferably 0.2% by mass or lower, or more preferably 0.1% by mass or lower (e.g. 0.05% by mass or lower).

When the polishing composition disclosed herein comprises a surfactant, the mass ratio (w1/w2) of amide group-containing polymer content w1 to surfactant content w2 is not particularly limited. For instance, it can be in a range of 0.01 to 100, or is in a range of preferably 0.05 to 50, or more preferably in a range of 0.1 to 30.

When the polishing composition disclosed herein is used in a polishing liquid form comprising an abrasive, the surfactant content relative to 100 parts by mass of the abrasive is suitably, for instance, 20 parts by mass or less, preferably 15 parts by mass or less, or more preferably 10 parts by mass or less (e.g. 6 parts by mass or less). From the standpoint of obtaining greater effect of the surfactant use, the surfactant content relative to 100 parts by mass of the abrasive is suitably 0.001 part by mass or greater, preferably 0.005 part by mass or greater, or more preferably 0.01 part by mass or greater (e.g. 0.1 part by mass or greater).

Alternatively, from the standpoint of simplifying the composition, etc., the polishing composition disclosed herein can be preferably made in an embodiment essentially free of a surfactant.

<Concentrate>

The polishing composition disclosed herein may be in a concentrated form (i.e. in a form of a concentrate of the polishing liquid) before supplied to an article. The polishing composition in a concentrated form as this is advantageous from the standpoint of the convenience and cost reduction for production, distribution, storage, etc. The concentration can be, for instance, about 2-fold to 100-fold by volume while it is usually suitably about 5-fold to 50-fold. The concentration of the polishing composition according to a preferable embodiment is 10-fold to 40-fold, for instance, 15-fold to 25-fold.

The polishing composition in a concentrated form as this can be used in an embodiment where it is diluted whenever desired to prepare a polishing liquid and the polishing liquid is supplied to an article. The dilution can be carried out typically by adding and mixing an aforementioned aqueous solvent with the concentrate. When the aqueous solvent is a solvent mixture, the dilution can be performed by adding just some of the components of the aqueous solvent or by adding a solvent mixture comprising the components at a mass ratio different from that of the aqueous solvent. With respect to a multi-pack polishing composition as described later, some of the packs may be diluted first and then mixed with other packs to prepare a polishing liquid, the multiple packs may be mixed first followed by dilution of the mixture to prepare a polishing liquid.

The concentrate can have an NV of, for instance, 50% by mass or lower. From the standpoint of the stability (e.g. dispersion stability of the abrasive) and ease of filtration of the polishing composition, etc., usually, the concentrate has an NV of suitably 40% by mass or lower, preferably 30% by mass or lower, or yet more preferably 20% by mass or lower, for instance, 15% by mass or lower. From the standpoint of the convenience and cost reduction for production, distribution, storage and so on, the NV of the concentrate is suitably 0.5% by mass or higher, preferably 1% by mass or higher, or more preferably 3% by mass or higher, for instance, 5% by mass or higher.

The amide group-containing polymer content in the concentrate can be, for instance, 3% by mass or lower. From the standpoint of the ease of filtration and washability of the polishing composition, etc., usually, the water-soluble polymer content is preferably 1% by mass or lower, or more preferably 0.5% by mass or lower. From the standpoint of the convenience and cost reduction for production, distribution, storage and so on, the water-soluble polymer content is usually suitably $1 \times 10^{-3}$ or higher, preferably $5 \times 10^{-3}$ or higher, or more preferably $1 \times 10^{-2}$ or higher.

When the polishing composition disclosed herein comprises an abrasive, the abrasive content in the concentrate can be, for instance, 50% by mass or lower. From the standpoint of the stability (e.g. dispersion stability of the abrasive) and ease of filtration of the polishing composition, etc., usually, the abrasive content is preferably 45% by mass or lower, or more preferably 40% by mass or lower. In a preferable embodiment, the abrasive content can be 30% by mass or lower, or even 20% by mass or lower (e.g. 15% by mass or lower). From the standpoint of the convenience and cost reduction for production, distribution, storage and so on, the abrasive content can be, for instance, 0.5% by mass or higher, preferably 1% by mass or higher, or more preferably 3% by mass or higher (e.g. 5% by mass or higher).

The polishing composition disclosed herein may be of a one-pack type or a multiple-pack type such as a two-pack type. For example, it can be formulated in a manner that for use in polishing a polishing object, a pack A comprising some of the components of the polishing composition (e.g. a dispersion comprising an abrasive (e.g. silica grains), a silicon wafer polishing accelerator and water) is mixed with a pack B comprising the rest of the components (e.g. a solution of an amide group-containing polymer). Alternatively, it can be used in an embodiment where, with a polishing composition comprising a silicon wafer polishing accelerator, an amide group-containing polymer and water, an abrasive separately obtained is mixed at a certain point of time.

<Preparation of Polishing Composition>

The method for producing the polishing composition disclosed herein is not particularly limited. For instance, the respective components of the polishing composition can be mixed, using a commonly known mixing device such as a propeller stirrer, ultrasonic disperser, homo mixer, etc. The way of mixing these components is not particularly limited. For instance, all the components can be mixed at once or in a suitably selected order.

<Polishing>

The polishing composition disclosed herein can be used for polishing an article, for instance, in an embodiment comprising the following operations. Described below is a preferable embodiment of the method for polishing an article using the polishing composition disclosed herein.

In particular, a polishing liquid (which is typically a slurry polishing liquid and sometimes called a polishing slurry) is obtained, comprising a polishing composition disclosed herein. The obtaining of the polishing liquid may include preparing the polishing liquid by subjecting the polishing composition to operations such as concentration adjustment (e.g. dilution), pH adjustment, etc. Alternatively, the polishing composition can be used straight as the polishing liquid. As for a multi-pack polishing composition, the obtaining of the polishing liquid may include mixing the packs, diluting a certain phase or multiple phases prior to the mixing, diluting the mixture after the mixing, and so on.

Subsequently, the polishing slurry is supplied to an article and polishing is carried out by a conventional method. For instance, when carrying out final polishing of a silicon wafer, the silicon wafer after a lapping step and preliminary polishing step is set in a general polishing machine and via a polishing pad in the polishing machine, the polishing slurry is supplied to the surface (surface to be polished) of the silicon wafer. Typically, while the polishing slurry is continuously supplied, the polishing pad is pushed against the surface of the silicon wafer, and the two are moved (e.g. moved in circular motion) in coordination. Via such a polishing step, polishing of the article is completed.

The polishing pad(s) used in the polishing step are not particularly limited. For instance, any of the non-woven fabric type, suede type, abrasive-bearing type, abrasive-free type, etc., can be used.

<Rinse>

A polished object polished with the polishing composition disclosed herein that comprises an abrasive may be rinsed with a rinse solution that comprises the same components as the polishing composition, but free of an abrasive. In other words, the art disclosed herein may have a rinsing step, that is, a step of rinsing the polished object with a rinse solution that comprises the same components as the polishing composition but free of an abrasive. The rinsing step can reduce the residue, such as abrasive grains, etc., that may cause defects and haze in the surface of the polished object. The rinsing step can be performed between two polishing steps, or after the final polishing step, but before the cleaning step described later. By rinsing with a rinse solution that is free of an abrasive, but otherwise comprises the same components as the polishing composition, defects and haze can be further reduced without hindering the effect of the amide group-containing polymer adsorbed on the silicon wafer surface. Such a rinse solution can be typically a silicon wafer polishing composition that comprises a silicon wafer polishing accelerator, an amide group-containing polymer and water (in particular, a composition used for rinsing in silicon wafer polishing, or a rinse composition). This silicon wafer rinse composition is abrasive-free, but otherwise, its composition and other features are basically the same as the silicon wafer polishing composition. Thus, the description is not repeated here.

<Cleaning>

The article polished with the polishing composition disclosed herein is typically cleaned after polished (after rinsed if necessary). The cleaning can be carried out, using a suitable cleaning solution. The cleaning solution used is not particularly limited. Usable examples include SC-1 solution (a mixture of ammonium hydroxide ($NH_4OH$), hydrogen peroxide ($H_2O_2$) and water ($H_2O$); cleaning with SC-1 cleaning solution is referred to as "SC-1 cleaning" hereinafter), SC-2 cleaning solution (a mixture of HCl, $H_2O_2$ and $H_2O$) and the like generally used in the field of semiconductors. The temperature of the cleaning solution can be, for instance, room temperature to about 90° C. From the standpoint of increasing the cleaning efficiency, a cleaning solution at about 50° C. to 85° C. can be preferably used.

Several working examples relating to the present invention are described below although the present invention is not to be limited to such working examples. In the description below, "parts" and "%" are based on mass unless otherwise specified.

<Measurement of Adsorption Ratio>

The respective water-soluble polymers used in Examples and Comparative Examples were measured for the ratio of adsorption onto the abrasive.

The water-soluble polymers subjected to the adsorption ratio measurement were as follows:
polyacryloylmorpholine (PACMO) Mw $4.5 \times 10^4$
poly(N-isopropylacrylamide) (PNIPAM) Mw $6.0 \times 10^4$
polyvinyl alcohol (PVA) Mw $2.6 \times 10^4$
cationized PVA Mw $2.6 \times 10^4$
polyvinylpyrrolidone (PVP) Mw $6.0 \times 10^4$ In particular, were mixed the water-soluble polymer to be measured (polymer of interest), aqueous ammonia (29% concentration) and deionized water to prepare a test solution L0 containing 0.018% the polymer of interest and 0.01% ammonia ($NH_3$) with the rest being water. The test solution L0 was measured for total organic carbons (TOC), using a TOC analyzer (combustion catalytic oxidation method, model name "TOC-5000A") available from Shimadzu Corporation.

On the other hand, were mixed the same abrasive as the one used in Examples and Comparative Examples described later, the polymer of interest, aqueous ammonia (29% concentration) and deionized water to prepare a test solution L1 containing 0.46% the abrasive, 0.018% the polymer of interest and 0.01% ammonia ($NH_3$) with the rest being water. The test solution L1 was centrifuged at a rotational speed of 20000 rpm for 30 minutes, using a centrifuge under model name "AVANTI HP-30I" available from Beckman Coulter, Inc. The centrifuged supernatant was collected and measured for TOC, using the TOC analyzer. From the TOC values of the test solution L0 and the supernatant of the test solution L1, the adsorption ratio of the polymer of interest was determined. The result is shown in Table 1.

<Preparation of Polishing Compositions>

Example 1

An abrasive, a water-soluble polymer and aqueous ammonia (29% concentration) and deionized water were mixed to obtain a polishing composition concentrate. The concentrate was diluted 20 times with deionized water to prepare a polishing composition according to Example 1.

As the abrasive, was used a colloidal silica of 35 nm average primary particle diameter and 66 nm average secondary particle diameter. The average primary particle diameter was measured with a surface area analyzer under trade name "FLOW SORB II 2300" available from Micromeritics. The average secondary particle diameter is the volume average secondary particle diameter measured with a model "UPA-UT151" available from Nikkiso Co., Ltd.

As the water-soluble polymer, PACMO was used

The abrasive, water-soluble polymer and aqueous ammonia were used in amounts equivalent to a 0.46% abrasive content, 0.018% water-soluble polymer content and 0.01% ammonia ($NH_3$) content, respectively, in the polishing composition. The polishing composition had a pH of 10.2.

Example 2

PNIPAM was used in place of PACMO. Otherwise, in the same manner as Example 1, a polishing composition according to Example 2 was prepared.

Comparative Examples 1-3

In place of PACMO, PVA (Comparative Example 1), cationized PVA (Comparative Example 2) and PVP (Comparative Example 3) were used. Otherwise, in the same manner as Example 1, polishing compositions according to Comparative Examples 1 to 3 were prepared.

<Silicon Wafer Polishing>

Using the polishing compositions according to the respective examples as they were as polishing liquids, silicon wafer surfaces were polished under the conditions shown below. As the silicon wafers, were used ones that had been roughly polished and had 300 mm diameter, p-type conductivity, crystal orientation of <100> and a resistivity of 0.1 $\Omega \cdot cm$ or greater, but less than 100 $\Omega \cdot cm$, and were preliminarily polished with a polishing slurry (trade name "GLAN-ZOX 2100" available from Fujimi, Inc.) to a surface roughness of 0.1 nm to 10 nm.

[Polishing Conditions]

Polishing machine: Sheet-type polisher with model number "PNX-332B" available from Okamoto Machine Tool Works, Ltd.

Polishing tables: Using two rear tables among three tables of the polishing machine, the first and second stages of final polishing after the preliminary polishing were carried out. (The Conditions Below were Common Between the Two Tables)

Polishing pressure: 15 kPa
Plate rotational speed: 30 rpm
Head rotational speed: 30 rpm
Polishing time: 2 min
Temperature of polishing liquid: 20° C.
Flow rate of polishing liquid: 2.0 L/min (drain)

<Cleaning>

Polished silicon wafers were cleaned (SC-1 cleaned) with a cleaning solution at $NH_4OH$ (29%)/$H_2O_2$ (31%)/deionized water (DIW)=1/3/30 (volume ratio). More specifically, two cleaning baths each attached with an ultrasonic wave oscillator of 950 kHz frequency were obtained; the cleaning solution was placed in each of the first and second cleaning baths and maintained at 60° C.; and each polished silicon wafer was immersed in the first cleaning bath for 6 minutes and then, via a ultrasonic rinsing bath with ultrapure water, in the second cleaning bath for 6 minutes, with the respective ultrasonic wave oscillators turned on.

<Assessment of the Number of Micro Particles>

Using a wafer inspection system under trade name "SURFSCAN SP2" available from KLA-Tencor Corporation, the number of 37 nm or larger particles (number of LPD) present on each cleaned silicon wafer of 300 mm diameter was counted. The results are converted to the relative values, with the number of LPD in Comparative Example 1 being 100%, and shown in Table 1. In the column for the LPD count, "n/m" (not measured) indicates that the defect analysis with the wafer inspection system resulted in data overload, that is, the number of LPD exceeded the upper measurement limit.

<Haze Measurement>

The surface of the respective cleaned silicon wafers were measured for haze (ppm) in DWO mode, using a wafer inspection system under trade name "SURFSCAN SP2" available from KLA-Tencor Corporation. The results are converted to the relative values, with the haze value of Comparative Example 1 being 100%, and shown in Table 1.

TABLE 1

| | Water-soluble polymer | | | |
| --- | --- | --- | --- | --- |
| Species | Mw (×10$^4$) | Adsorption ratio (%) | Haze (%) | LPD (%) |
| Ex. 1 | PACMO | 4.5 | 15 | 85 | 22 |
| Ex. 2 | PNIPAM | 6.0 | 35 | 71 | 41 |
| Comp. Ex. 1 | PVA | 2.6 | 0 | 100 | 100 |
| Comp. Ex. 2 | Cationized PVA | 2.6 | 11 | 95 | 115 |
| Comp. Ex. 3 | PVP | 6.0 | 90 | 199 | n/m |

As shown in Table 1, the polishing compositions of Examples 1 and 2—each using, as a water-soluble polymer, an amide group-containing polymer that has a secondary or tertiary amide group whose carbonyl carbon is directly coupled to a carbon atom constituting the polymer's main chain (an amide group-containing polymer having a building unit A in its main chain)—were superior in terms of both LPD reduction and haze reduction in comparison to Comparative Examples 1 to 3 using PVA, cationized PVA and PVP as the water-soluble polymer. From these results, it is evident that by polishing with the silicon wafer polishing composition comprising the amide group-containing polymer, defects and haze can be effectively reduced.

Although specific embodiments of the present invention have been described in detail above, these are merely for illustrations and do not limit the scope of claims. The art according to the claims includes various modifications and changes made to the specific embodiments illustrated above.

The invention claimed is:

1. A method for polishing a surface of a silicon wafer, the method comprising the steps of:
   (a) obtaining a polishing composition comprising an abrasive, a silicon wafer polishing accelerator, an amide group-containing polymer, and water, the abrasive consisting of silica grains and a pH of the polishing composition being 9.0 or higher;
   (b) supplying the polishing composition to the silicon wafer surface; and
   (c) polishing the silicon wafer surface thereby obtaining the silicon wafer with a polished surface,
   wherein the amide group-containing polymer
   is a polymer or copolymer of one or more monomer selected from the group consisting of monomers represented by formula (2):

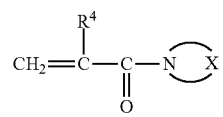

(2)

wherein $R^4$ is a hydrogen atom, methyl group, phenyl group, benzyl group, chloro group, difluoromethyl group, trifluoromethyl group, or cyano group; and X is $(CH_2)n$ (n is an integer between 4 and 6), $(CH_2)_2O(CH_2)_2$ or $(CH_2)_2S(CH_2)_2$; and monomers represented by formula (3):

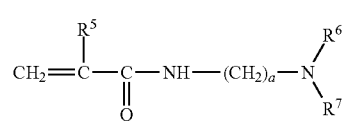

(3)

wherein $R^5$ is a hydrogen atom, methyl group, phenyl group, benzyl group, chloro group, difluoromethyl group, trifluoromethyl group, or cyano group; $R^6$ and $R^7$ are identical or different, with each being a hydrogen atom, an alkyl group, alkenyl group, alkynyl group, aralkyl group, alkoxy group, alkoxyalkyl group, alkylol group or acetyl group with 1 to 8 carbon atoms, or an aromatic group with 6 to 60 carbon atoms, with each of which except for the hydrogen atom including a species having a substituent; and a is an integer between 1 and 5.

2. The method according to claim 1, further comprising the step of rinsing the silicon wafer after the polishing step by supplying a rinse composition to the silicon wafer, wherein the rinse composition comprises a silicon wafer polishing accelerator, an amide group-containing polymer, and water, the amide group-containing polymer in the rinse composition is a polymer or copolymer of one or more monomer selected from the group consisting of monomers represented by formula (1):

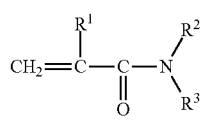

wherein $R^1$ is a hydrogen atom, methyl group, phenyl group, benzyl group, chloro group, difluoromethyl group, trifluoromethyl group, or cyano group; $R^2$ and $R^3$ are identical or different wherein $R^2$ is a hydrogen atom, an alkyl group, alkenyl group, alkynyl group, aralkyl group, alkoxy group, alkoxyalkyl group, alkylol group or acetyl group with 1 to 18 carbon atoms, or an aromatic group with 6 to 60 carbon atoms, with each of which except for the hydrogen atom including a species having a substituent, and $R^3$ is an alkyl group, alkenyl group, alkynyl group, aralkyl group, alkoxy group, alkoxyalkyl group, alkylol group or acetyl group with 1 to 18 carbon atoms, or an aromatic group with 6 to 60 carbon atoms, with each of which including a species having a substituent;

monomers represented by formula (2):

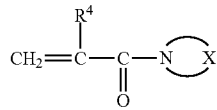

wherein $R^4$ is a hydrogen atom, methyl group, phenyl group, benzyl group, chloro group, difluoromethyl group, trifluoromethyl group, or cyano group; and X is $(CH_2)n$ (n is an integer between 4 and 6), $(CH_2)_2O(CH_2)_2$ or $(CH_2)_2S(CH_2)_2$; and monomers represented by formula (3):

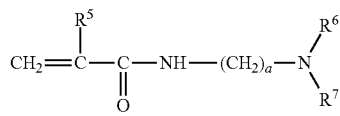

wherein $R^5$ is a hydrogen atom, methyl group, phenyl group, benzyl group, chloro group, difluoromethyl group, trifluoromethyl group, or cyano group; $R^6$ and $R^7$ are identical or different, with each being a hydrogen atom, an alkyl group, alkenyl group, alkynyl group, aralkyl group, alkoxy group, alkoxyalkyl group, alkylol group or acetyl group with 1 to 8 carbon atoms, or an aromatic group with 6 to 60 carbon atoms, with each of which except for the hydrogen atom including a species having a substituent; and a is an integer between 1 and 5.

3. The method according to claim 2, wherein the rinse composition is free of an abrasive which consists of inorganic grains.

4. The method according to claim 2, wherein the rinse composition is free of an abrasive which consists of inorganic grains, the inorganic grains being silica grains, alumina grains, cerium oxide grains, chromium oxide grains, titanium dioxide grains, zirconium oxide grains, magnesium oxide grains, manganese dioxide grains, zinc oxide grains, red oxide grains, silicon nitride grains, boron nitride grains, silicon carbide grains, boron carbide grains, diamond grains, calcium carbonate grains, and barium carbonate grains.

5. The method according to claim 2, wherein the amide group-containing polymer contained in the rinse composition is nonionic.

6. The method according to claim 2, wherein the amide group-containing polymer contained in the rinse composition has a molecular weight of below $40 \times 10^4$.

7. The method according to claim 2, wherein the amide group-containing polymer contained in the rinse composition has a molecular weight of below $5 \times 10^4$.

8. The method according to claim 2, wherein the amide group-containing polymer contained in the rinse composition is a polymer or copolymer of one or more monomer represented by the formula (2) or a polymer or copolymer of one or more monomer represented by the formula (3), and the amide group-containing polymer in the rinse composition has a molecular weight of below $10 \times 10^4$.

9. The method according to claim 1, further comprising the step of carrying out a preliminary polishing of the silicon wafer prior to the polishing.

10. The method according to claim 9, further comprising the step of carrying out a lapping of the silicon wafer prior to the preliminary polishing.

11. The method according to claim 1, wherein the amide group-containing polymer has an adsorption ratio of 10% to 80%, measuring the adsorption ratio by:
 (1) preparing a test solution L0 comprising 0.018% by mass of the amide group-containing polymer and 0.01% by mass of ammonia in water;
 (2) preparing a test solution L1 comprising 0.46% by mass of the abrasive, 0.018% by mass of the amide group-containing polymer, and 0.01% by mass of ammonia in water;
 (3) centrifuging the test solution L1 thereby precipitating the abrasive;
 (4) determining the adsorption ratio from the mass W0 of the measured polymer in the test solution L0 and mass W1 of the measured polymer in the supernatant of the centrifuged test solution L1, using the following equation:

Adsorption ratio(%)=$[(W0-W1)/W0] \times 100$.

12. The method according to claim 1, wherein the amide group-containing polymer is nonionic.

13. The method according to claim 1, wherein the amide group-containing polymer has a molecular weight of below $40 \times 10^4$.

14. The method according to claim 1, wherein the amide group-containing polymer has a molecular weight of below $5 \times 10^4$.

15. The method according to claim 1, wherein the amide group-containing polymer has a molecular weight of below $10 \times 10^4$.

16. The method according to claim 1, wherein the silicon wafer polishing composition consists of the abrasive, the silicon wafer polishing accelerator, the amide group-containing polymer, water and optionally a surfactant, an optional polymer and an additive, and
 wherein the additive is selected from the group consisting of a chelating agent, an inorganic acid, an inorganic acid salt, a preservative and an antifungal agent.

17. The method according to claim 1, wherein the silicon wafer comprises monocrystalline silicon.

18. The method according to claim 1, wherein the polished surface of the silicon wafer does not undergo further polishing steps.

19. A method for polishing a surface of a silicon wafer, the method comprising the steps of:
(a) obtaining a polishing composition comprising an abrasive, a silicon wafer polishing accelerator, an amide-containing polymer, and water, the abrasive consisting of silica grains and a pH of the polishing composition being 9.0 or higher;
(b) supplying the polishing composition to the silicon wafer surface;
(c) polishing the silicon wafer surface thereby obtaining the silicon wafer with a polished surface; and
(d) rinsing the silicon wafer after the polishing step by supplying a rinse composition to the silicon wafer,
wherein:
the amide group-containing polymer in the polishing composition is a polymer or copolymer of one or more monomers selected from the group consisting of monomers represented by formula (1):

(1)

wherein $R^1$ is a hydrogen atom, methyl group, phenyl group, benzyl group, chloro group, difluoromethyl group, trifluoromethyl group, or cyano group; $R^2$ and $R^3$ are identical or different wherein $R^2$ is a hydrogen atom, an alkyl group, alkenyl group, alkynyl group, aralkyl group, alkoxy group, alkoxyalkyl group, alkylol group or acetyl group with 1 to 18 carbon atoms, or an aromatic group with 6 to 60 carbon atoms, with each of which except for the hydrogen atom including a species having a substituent, and $R^3$ is an alkyl group, alkenyl group, alkynyl group, aralkyl group, alkoxy group, alkoxyalkyl group, alkylol group or acetyl group with 1 to 18 carbon atoms, or an aromatic group with 6 to 60 carbon atoms, with each of which including a species having a substituent;
the amide group-containing polymer in the polishing composition has a molecular weight of below $5\times10^4$;
the rinse composition comprises a silicon wafer polishing accelerator, an amide-containing polymer, and water; and
the amide group-containing polymer in the rinse composition is a polymer or copolymer of one or more monomers selected from the group consisting of monomers represented by formula (1):

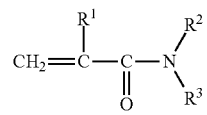
(1)

wherein $R^1$ is a hydrogen atom, methyl group, phenyl group, benzyl group, chloro group, difluoromethyl group, trifluoromethyl group, or cyano group; $R^2$ and $R^3$ are identical or different wherein $R^2$ is a hydrogen atom, an alkyl group, alkenyl group, alkynyl group, aralkyl group, alkoxy group, alkoxyalkyl group, alkylol group or acetyl group with 1 to 18 carbon atoms, or an aromatic group with 6 to 60 carbon atoms, with each of which except for the hydrogen atom including a species having a substituent, and $R^3$ is an alkyl group, alkenyl group, alkynyl group, aralkyl group, alkoxy group, alkoxyalkyl group, alkylol group or acetyl group with 1 to 18 carbon atoms, or an aromatic group with 6 to 60 carbon atoms, with each of which including a species having a substituent;
monomers represented by formula (2):

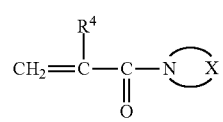
(2)

wherein $R^4$ is a hydrogen atom, methyl group, phenyl group, benzyl group, chloro group, difluoromethyl group, trifluoromethyl group, or cyano group; and X is $(CH_2)n$ (n is an integer between 4 and 6), $(CH_2)_2O(CH_2)_2$ or $(CH_2)_2S(CH_2)_2$; and
monomers represented by formula (3):

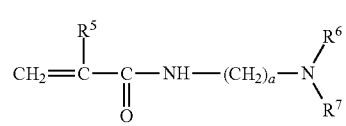
(3)

wherein $R^5$ is a hydrogen atom, methyl group, phenyl group, benzyl group, chloro group, difluoromethyl group, trifluoromethyl group, or cyano group; $R^6$ and $R^7$ are identical or different, with each being a hydrogen atom, an alkyl group, alkenyl group, alkynyl group, aralkyl group, alkoxy group, alkoxyalkyl group, alkylol group or acetyl group with 1 to 8 carbon atoms, or an aromatic group with 6 to 60 carbon atoms, with each of which except for the hydrogen atom including a species having a substituent; and a is an integer between 1 and 5.

* * * * *